United States Patent
Ahn

(10) Patent No.: US 7,728,796 B2
(45) Date of Patent: Jun. 1, 2010

(54) ORGANIC ELECTROLUMINESCENCE DEVICE AND METHOD OF DRIVING THE SAME

(75) Inventor: Ju Won Ahn, Seoul (KR)

(73) Assignee: LG Display Co., Ltd., Seoul (KR)

( * ) Notice: Subject to any disclaimer, the term of this patent is extended or adjusted under 35 U.S.C. 154(b) by 1141 days.

(21) Appl. No.: 11/356,148

(22) Filed: Feb. 17, 2006

(65) Prior Publication Data

US 2007/0030218 A1 Feb. 8, 2007

(30) Foreign Application Priority Data

Aug. 4, 2005 (KR) .................. 10-2005-0071294

(51) Int. Cl.
*G09G 3/30* (2006.01)
(52) U.S. Cl. ........................................ 345/76
(58) Field of Classification Search ........... 345/30–111; 315/169.3
See application file for complete search history.

(56) References Cited

U.S. PATENT DOCUMENTS 5,216,710 A * 6/1993 Huang ..................... 379/362
6,747,617 B1   6/2004 Kawashima ................. 345/76
7,084,848 B2 * 8/2006 Senda et al. .................. 345/92

FOREIGN PATENT DOCUMENTS

KR   10-2001-0051764    6/2001
KR   10-2002-0031884    5/2002

\* cited by examiner

*Primary Examiner*—Srilakshimi K Kumar
(74) *Attorney, Agent, or Firm*—Morgan Lewis & Bockius LLP

(57) ABSTRACT

Embodiments of the present invention relate to an organic electroluminescent device using different driving voltages according to sub-pixels. The organic electroluminescent device may include a panel, a driving voltage circuit and a driver. The panel may have a plurality of sub-pixels. The driving voltage circuit may generate a plurality of driving voltages. The driver may drive the sub-pixels by using the generated driving voltages. The organic electroluminescent device may use driving voltages corresponding to sub-pixels, and power consumption may be reduced.

13 Claims, 4 Drawing Sheets

output omitted for brevity …

ORGANIC ELECTROLUMINESCENCE DEVICE AND METHOD OF DRIVING THE SAME

CROSS-REFERENCE TO RELATED APPLICATIONS

This application claims priority from Korean Patent Application No. 2005-71294, filed on Aug. 4, 2005, the subject matter of which is incorporated herein by reference.

BACKGROUND OF THE INVENTION

1. Field of the Invention

The present invention relates to a display device and, more particularly, an organic electroluminescent device and a method of driving the same.

2. Background of Related Art

An organic electroluminescent device is a self light-emitting device that emits light having a predetermined wavelength when a certain voltage is applied thereto.

FIG. 1 is a plane view illustrating an organic electroluminescent device according to an example arrangement. Other arrangements are also possible. More specifically, FIG. 1 shows an organic electroluminescent device 100 that includes a panel 104 and an integrated circuit chip 106.

The panel 104 includes a cell circuit 108, data lines 118 and scan lines 120A and 120B. The cell circuit 108 has anode electrode layers 110 and cathode electrode layers 112.

A plurality of sub-pixels 114 are formed in cross areas of the anode electrode layers 110 and the cathode electrode layers 112. The sub-pixels 114 may include red sub-pixels, green sub-pixels and blue sub-pixels. A red sub-pixel, a green sub-pixel and a blue sub-pixel which are located in sequence form a pixel 116 as shown in FIG. 1.

The data lines 118 are connected to the anode electrode layers 110 and transmit data signals provided from the integrated circuit chip 106 to the sub-pixels 114. The scan lines 120A and 120B are connected to the cathode electrode layers 112, and transmit scan signals provided from the integrated circuit chip 106 to the sub-pixels 114. The integrated circuit chip 106 includes a driving voltage source 122 and a driver 124.

The driving voltage source 122 receives a voltage (for example 15V) from an apparatus for supplying power source (shown as element 102). The driver 124 drives the sub-pixels 114 by using a driving voltage (i.e., the voltage provided from the driving voltage source 122). Here, driving voltages for the sub-pixels are substantially different according to the sub-pixels.

Nevertheless, the organic electroluminescent device 100 may set a driving voltage for every sub-pixel 114. For example, although a green driving voltage of 12V may be required for the green sub-pixels, 15V corresponding to the red sub-pixels may be set as the green driving voltage. Accordingly, power consumption of the organic electroluminescent device may be increased.

In addition, the driver 124 may use a driving voltage source 122 irrespective of the sub-pixels 114, and therefore interference may be generated between sub-pixels. As a result, the sub-pixels may not display a desired image.

SUMMARY OF THE INVENTION

Embodiments of the present invention may provide an organic electroluminescent device and a method of driving the same capable of reducing power consumption and eliminating (or substantially eliminating) interference between sub-pixels and reducing power consumption.

An organic electroluminescent device according to one embodiment of the present invention may include a panel, a driving voltage circuit and a driver. The panel has a plurality of sub-pixels. The driving voltage circuit may generate (or provide) a plurality of driving voltages. The driver may drive the sub-pixels by using the generated driving voltages.

The sub-pixels may include red, green and blue sub-pixels. One of the driving voltages may have a different magnitude from one of the driving voltage. Additionally, the driving voltage circuit may include a plurality of driving voltage source, for generating the driving voltages. The driver may include a red driving circuitry for driving the red sub-pixels, a green driving circuitry for driving the green sub-pixels, and a blue circuitry for driving the blue sub-pixels.

Additionally, a voltage adjusting circuit may receive a voltage from outside the electroluminescent device and adjust the received voltage. The voltage adjusting circuit may apply the adjusted voltages to the plurality of driving voltage sources.

A method of driving an organic electroluminescent device according to one embodiment of the present invention may include generating (or providing) a plurality of driving voltages by using a voltage applied from outside (i.e., outside the electroluminescent device) and driving the sub-pixels by using the generated driving voltages.

Embodiments of the present invention may use driving voltages corresponding to sub-pixels. Therefore, power consumption may be reduced.

Additionally, an organic electroluminescent device and a method of driving the same may use different circuitries and driving voltage sources in accordance with sub-pixels. This may avoid or substantially avoid interference generated between the sub-pixels. Accordingly, a desired image may be displayed on the organic electroluminescent device.

Other objects, advantages and salient features of the invention may become apparent from the following detailed description taken in conjunction with the annexed drawings, which disclose embodiments of the invention.

BRIEF DESCRIPTION OF THE DRAWINGS

The invention will be described in detail with reference to the following drawings in which like reference numerals refer to like elements and wherein.

DETAILED DESCRIPTION OF PREFERRED EMBODIMENTS

Figure 1:
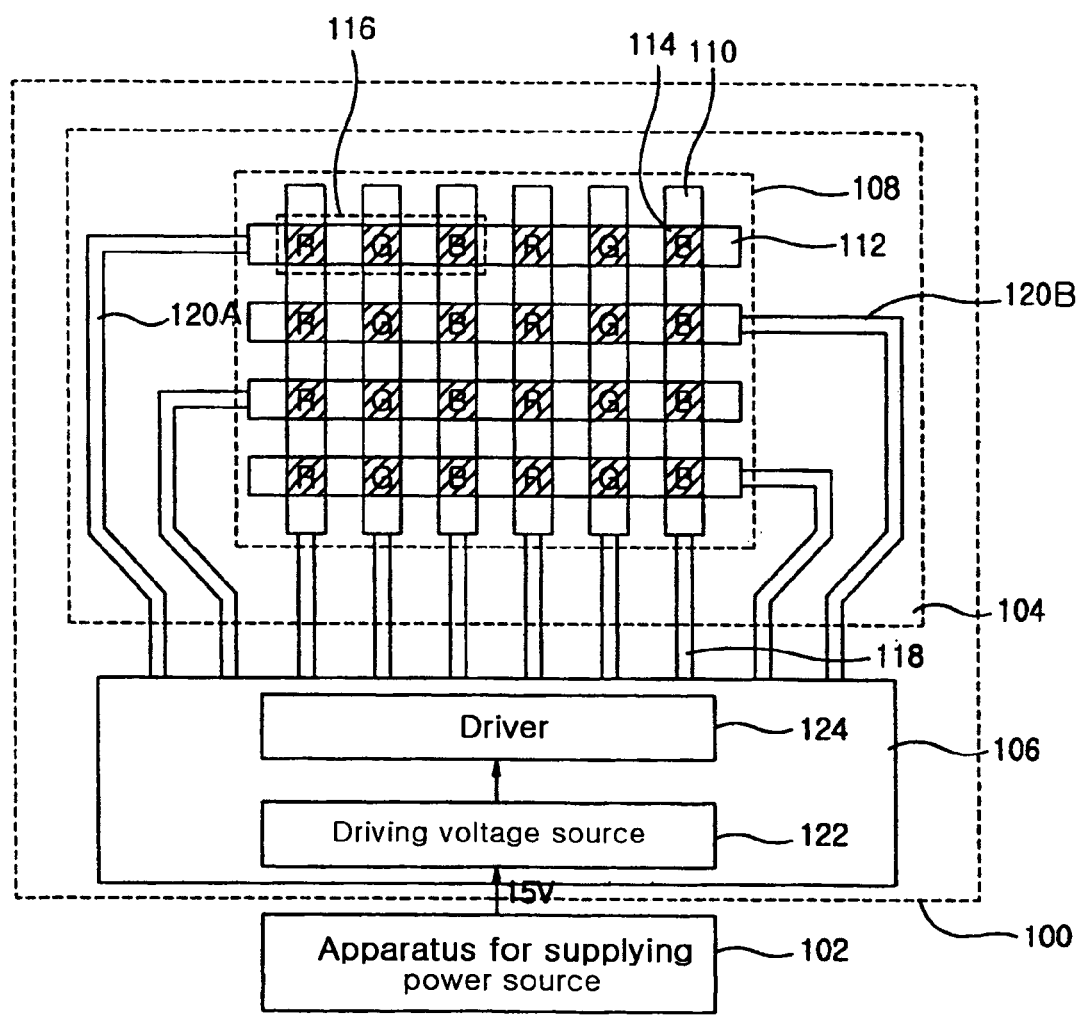
FIG. 1 is a plane view illustrating an organic electroluminescent device according to an exemplary arrangement.
Figure 2:
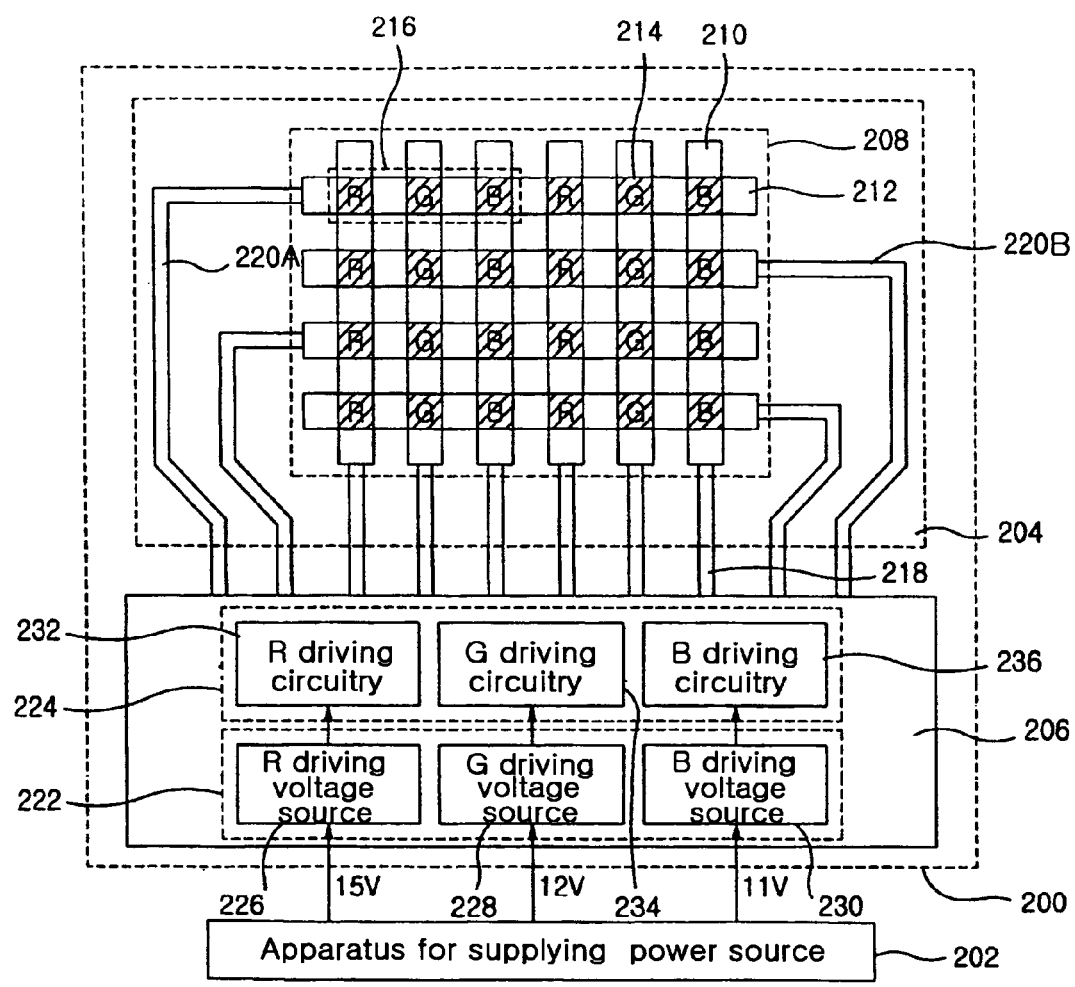
FIG. 2 is a plane view illustrating an organic electroluminescent device according to an exemplary embodiment of the present invention.

FIG. 2 is a plane view illustrating an organic electroluminescent device according to an exemplary embodiment of the present invention. Other embodiments and configurations are also within the scope of the present invention. More specifically, FIG. 2 shows an organic electroluminescent device 200 that includes a panel 204 and an integrated circuit chip 206. The panel 204 has a cell circuit 208, data lines 218, and scan lines 220A and 220B. The cell circuit 208 includes anode electrode layers 210 and cathode electrode layers 212.

A plurality of sub-pixels 214 are formed in cross areas of the anode electrode layers 210 and the cathode electrode layers 212. The sub-pixels 214 may include red sub-pixels, green sub-pixels and blue sub-pixels. A red sub-pixel, a green sub-pixel and a blue sub-pixel which are located in sequence form a pixel 216 as shown in FIG. 2. Accordingly, the pixel may emit a light having various colors by using the red sub-pixel, the green sub-pixel and the blue sub-pixel.

The data lines 218 are connected to the anode electrode layers 210 and transmit data signals provided from the integrated circuit chip 206 to the sub-pixels 214. The scan lines 220A and 220B are connected to the cathode electrode layers 212, and transmit scan signals provided from the integrated circuit chip 206 to the sub-pixels 214.

The integrated circuit chip 206 includes a driving voltage circuit 222 and a driver 224. The driving voltage circuit 222 has a red driving voltage source 226, a green driving voltage source 228 and a blue driving voltage source 230. Further, the driving voltage circuit 222 may receive a plurality of different driving voltages from an apparatus for supplying power source (shown as element 202). The driver 224 may include a red driving circuitry 232, a green driving circuitry 234 and a blue driving circuitry 236.

The red driving circuitry 232 may drive the red sub-pixels by using a red driving voltage outputted from the red driving voltage source 226. The red driving voltage may be a maximum voltage difference of both terminals of the red sub-pixel. More particularly, the red driving circuitry 232 may transmit the scan signals and the data signals by using the red driving voltage outputted from the red driving voltage source 226. As a result, the red sub-pixels may display an image corresponding to the data signals.

The green driving circuitry 234 may drive the green sub-pixels by using a green driving voltage outputted from the green driving voltage source 228. The blue driving circuitry 236 may drive the blue sub-pixels by using a blue driving voltage outputted from the blue driving voltage source 230. The red, green and blue driving voltages according to one embodiment of the present invention may have different magnitudes.

In the following example, a minimum driving voltage for driving the red sub-pixels may be 13V, a minimum driving voltage for driving the green sub-pixels may be 10V, and a minimum voltage for driving the blue sub-pixels may be 9V. In this example, the apparatus for supplying power source 202 may apply a first voltage of 15V to the red driving voltage source 226, a second voltage of 12V to the green driving voltage source 228, and a third voltage of 11V to the blue driving voltage source 236. Accordingly, the driving voltages of the red driving circuitry 232, the green driving circuitry 234 and the blue driving circuitry 236 are 15V, 12V and 11V, respectively. Each of the driving voltages may be higher than the minimum driving voltage by a certain voltage (2V) considering tolerance of design. In another embodiment, the driving voltages may be identical (or substantially identical) to the minimum driving voltages.

In the organic electroluminescent device 200, the driving voltages may have corresponding magnitudes to each of the red, green and blue sub-pixels, unlike other electroluminescent devices. Accordingly, power consumption in the organic electroluminescent device 200 may be reduced as compared to other organic electroluminescent devices.

In addition, the organic electroluminescent device 200 may employ different driving voltage sources 226, 228 and 230 in accordance with the driving circuitries 232, 234 and 236, unlike other organic electroluminescent devices. Hence, in the organic electroluminescent device 200, no interference (or reduced interference) may be generated between the driving circuitries 232, 234 and 236. Accordingly, the organic electroluminescent device 200 may naturally display a desired image.

Figure 3:
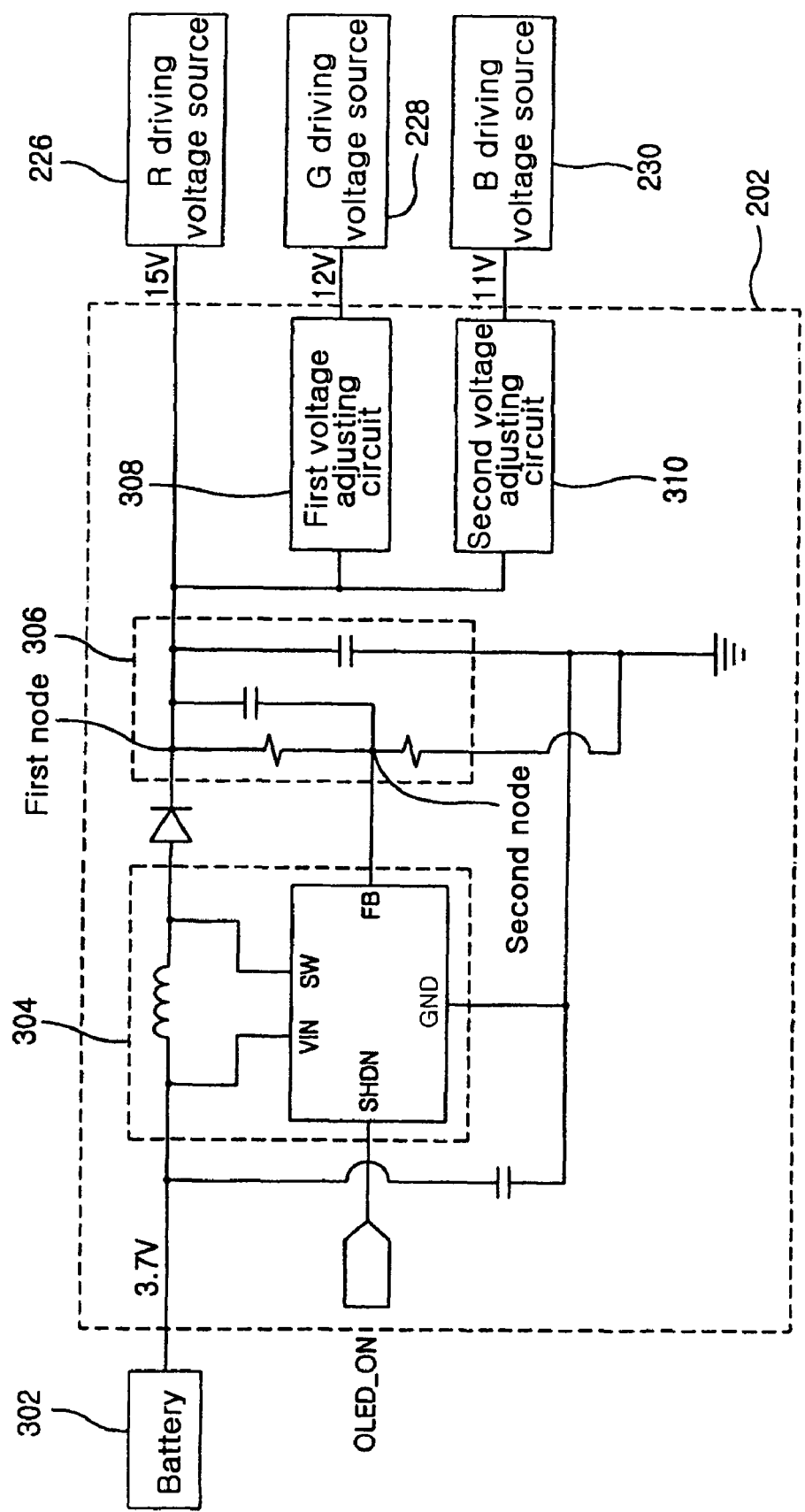
FIG. 3 is a plane view illustrating a circuit of the apparatus for supplying power source of FIG. 2 according to one embodiment of the present invention.

FIG. 3 is a plane view illustrating a circuit of the apparatus for supplying power source of FIG. 2 according to one embodiment of the present invention. Other embodiments and configurations are also within the scope of the present invention.

As shown in FIG. 3, the apparatus for supplying power source may include a boosting circuit 304, a boosted voltage detecting circuit 306, a first voltage adjusting circuit 308 and a second voltage adjusting circuit 310. The boosting circuit 304 may have a boosting integrated circuit chip and an inductor to boost a battery voltage applied from a battery 302.

The boosted voltage detecting circuit 306 may detect the boosted battery voltage by using resistors in parallel, and provide information concerning the detected voltage to a FB terminal of the boosting integrated circuit chip. More specifically, the boosted voltage detecting circuit 306 may detect a voltage of a second node and provide the voltage of the second node to the FB terminal of the boosting integrated circuit chip. Subsequently, the boosting circuit 304 may analyze the information concerning the detected voltage provided from the boosted voltage detecting circuit 306 and adjust a boosting rate in accordance with the analysis.

Hereinafter, a voltage to be applied to the red driving voltage source 226 may be 15V. The boosting circuit 304 may boost the battery voltage of 3.7V so that the boosted battery voltage is 13.5V for example. In this case, the boosted voltage detecting circuit 306 detects that the boosted battery voltage is 13.5V and provides the information concerning the detected voltage to the FB terminal of the boosting integrated circuit chip.

The boosting circuit 304 may analyze the information and note that the boosted battery voltage is 13.5V. Accordingly, the boosting circuit 304 may increase the boosting rate in order to boost the voltage up to 15V. The apparatus for supplying power source 202 may boost the battery voltage up to a desired voltage through the above process.

The boosted battery voltage of 15V may be applied to the red driving voltage source 226. The first voltage adjusting circuit 308 may adjust (e.g., lower the boosted battery voltage) and apply the adjusted voltage to the green driving voltage source 228. The second voltage may adjust (e.g., lower the boosted battery voltage) and apply the adjusted voltage to the blue driving voltage source 230.

In short, the apparatus for supplying power source 202 according to an embodiment of the present invention may apply the voltages having different magnitudes to the driving voltage sources 226, 228 and 230.

Figure 4:
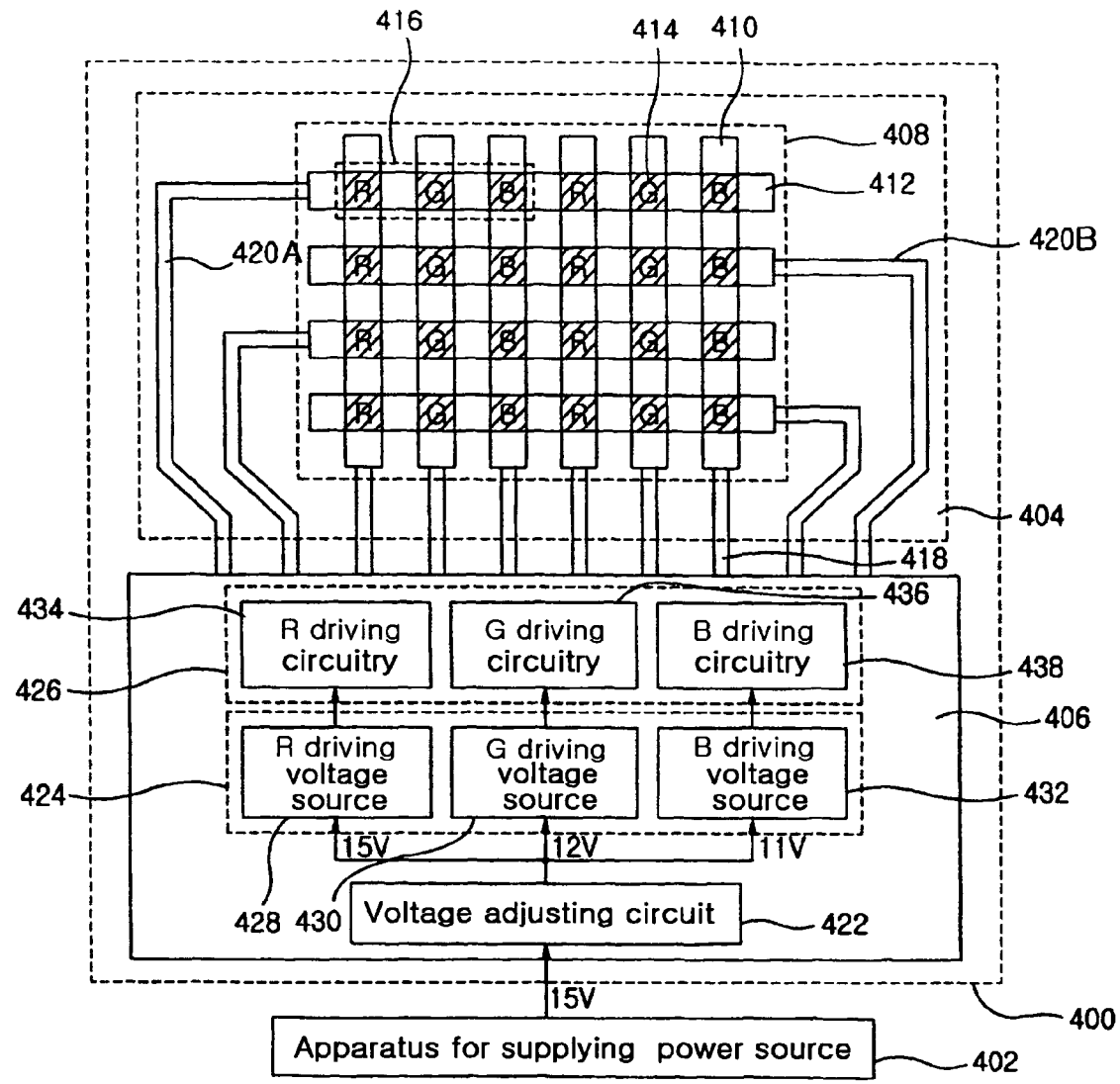
FIG. 4 is a plane view illustrating an organic electroluminescent device according to an exemplary embodiment of the present invention.

FIG. 4 is a plane view illustrating an organic electroluminescent device according to an exemplary embodiment of the present invention. Other embodiments and configurations are also within the scope of the present invention.

More specifically, FIG. 4 shows an organic electroluminescent device 400 that includes a panel 404 and an integrated circuit chip 406. The panel 404 may be the same as the panel 204 in FIG. 2 and therefore further details concerning the panel 404 will be omitted for ease of illustration.

The integrated circuit chip 406 may include a voltage adjusting circuit 422, a driving voltage circuit 424 and a driver 426. The voltage adjusting circuit 422 may adjust a voltage applied from the apparatus for supplying power source (shown as element 402) according to the sub-pixels, and provide the adjusted voltage to the driving voltage sources 428, 430 and 432.

As one example, the voltage adjusting circuit 422 may adjust a voltage of 15V applied from the apparatus for supplying power source 402, and then provide a first voltage of 15V, a second voltage of 12V and a third voltage of 11V to the red, green and blue driving voltage sources 428, 430 and 432, respectively. As a result, the red, green and blue driving voltages may be 15V, 12V and 11V, respectively.

The driver 436 may include a red driving circuitry 434, a green driving circuitry 436 and a blue driving circuitry 438. The driving circuitries 434, 436 and 438 drive the red, green and blue sub-pixels by using the driving voltages provided from the driving voltage sources 428, 430 and 432.

Embodiments of the electroluminescent device of the present invention may be used in or formed as flexible display for electronic books, newspapers and magazines, different types of portable devices, e.g., handsets, MP3 players, notebook computers, etc., vehicle audio applications, vehicle navigation applications, televisions, monitors, or other types of devices.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A circuit for driving an electroluminescent device comprising:
    a power source supplier receiving a DC voltage from a DC source and providing the plurality of different driving voltages, wherein the power source supplier including:
        a boosting circuit boosting the DC voltage up to a red driving voltage suitable for driving red sub-pixels and providing the red driving voltage to a red driving voltage source;
        a first voltage adjusting circuit adjusting the red driving voltage to a green driving voltage suitable for driving green sub-pixels and providing the green driving voltage to a green driving voltage source; and
        a second voltage adjusting circuit adjusting the red driving voltage to a blue driving voltage suitable for driving blue sub-pixels and providing the blue driving voltage to a blue driving voltage source; and
    a driver that drives the red, green and blue sub-pixels by using the provided red, green and blue driving voltages.

2. The circuit of claim 1, wherein the driver includes:
    a red driving circuitry to drive red sub-pixels by receiving the red driving voltage from the red driving voltage source;
    a green driving circuitry to drive green sub-pixels by receiving the green driving voltage from the green driving voltage source; and
    a blue driving circuitry to drive blue sub-pixels by receiving the blue driving voltage from the blue driving voltage source.

3. The circuit of claim 1, wherein the power source supplier further comprising a boosted voltage detecting circuit to detect the boosted DC voltage from the boosting circuit and to provide information concerning the detected boosted DC voltage back to the boosting circuit in order to control a boosting rate of the boosting circuit.

4. The circuit of claim 1, wherein the electroluminescent device comprises an organic electroluminescent device.

5. The circuit of claim 1, wherein the red, green and blue driving voltage sources and the driver are provided on an integrated chip.

6. An electroluminescent device comprising:
    a plurality of scan lines in a first direction;
    a plurality of data lines in a second direction, the first and second direction being different;
    a plurality of pixels, each pixel including a red sub-pixel, a green sub-pixel and a blue sub-pixel, and each sub-pixel including a corresponding data line and a corresponding scan line; and
    a driving circuit coupled to at least one of the scan lines or the data lines, wherein the driving circuit comprising:
        a power source supplier receiving a DC voltage from a DC source and providing the plurality of different driving voltages, wherein the power source supplier including:
            a boosting circuit boosting the DC voltage up to a red driving voltage suitable for driving the red sub-pixel and providing the red driving voltage to a red driving voltage source;
            a first voltage adjusting circuit adjusting the red driving voltage to a green driving voltage suitable for driving the green sub-pixel and providing the green driving voltage to a green driving voltage source; and
            a second voltage adjusting circuit adjusting the red driving voltage to a blue driving voltage suitable for driving the blue sub-pixel and providing the blue driving voltage to a blue driving voltage source; and
        a driver that drives the red, green and blue sub-pixels by using the provided red, green and blue driving voltages.

7. The electroluminescent device of claim 6, wherein the power source supplier further comprising a boosted voltage detecting circuit to detect the boosted DC voltage from the boosting circuit and to provide information concerning the detected boosted DC voltage back to the boosting circuit in order to control a boosting rate of the boosting circuit.

8. The electroluminescent device of claim 7, wherein the driver comprises a plurality of data drivers for driving the data lines with a plurality of different driving voltages.

9. The electroluminescent device of claim 7, wherein the driving circuit is provided on an integrated chip, and the integrated chip includes the first and second voltage adjusting circuits.

10. The electroluminescent device of claim 9 wherein the driver includes:
    a red driving circuitry to drive red sub-pixels by receiving the red driving voltage from the red driving voltage source;
    a green driving circuitry to drive green sub-pixels by receiving the green driving voltage from the green driving voltage source; and
    a blue driving circuitry to drive blue sub-pixels by receiving the blue driving voltage from the blue driving voltage source.

11. The electroluminescent device of claim 6, wherein the electroluminescent device comprises an organic electroluminescent device.

12. A method of driving an electroluminescent device having a plurality of pixels, each pixel including a red sub-pixel, a green sub-pixel and a blue sub-pixel, comprising:

receiving a DC voltage from a DC source;

boosting the DC voltage up to a red driving voltage suitable for driving the red-pixel and providing the red driving voltage;

adjusting the red driving voltage to a green driving voltage suitable for driving green sub-pixels and providing the green driving voltage;

adjusting the red driving voltage to a blue driving voltage suitable for driving blue sub-pixels and providing the blue driving voltage to a blue driving voltage source; and driving the red, green and blue sub-pixels by using the provided red, green and blue driving voltages.

13. The method of claim 12, further comprising:

detecting the boosted DC voltage to control a boosting rate of the boosted DC voltage in order to have a desired voltage.

* * * * *